United States Patent [19]

Tomimitsu

[11] Patent Number: 4,593,394
[45] Date of Patent: Jun. 3, 1986

[54] METHOD CAPABLE OF SIMULTANEOUSLY DECODING TWO REPRODUCED SEQUENCES

[75] Inventor: Yasuharu Tomimitsu, Tokyo, Japan
[73] Assignee: NEC Corporation, Tokyo, Japan
[21] Appl. No.: 537,211
[22] Filed: Sep. 29, 1983
[30] Foreign Application Priority Data
Sep. 30, 1982 [JP] Japan ................................ 57-171682
[51] Int. Cl.⁴ ............................................. G06F 11/10
[52] U.S. Cl. ......................................... 371/39; 371/38
[58] Field of Search .......................... 371/37, 38, 39, 40
[56] References Cited

U.S. PATENT DOCUMENTS

| 4,398,292 | 8/1983 | Doi et al. ............................. 371/39 |
| 4,433,415 | 2/1984 | Kojima ................................ 371/37 |
| 4,437,185 | 3/1984 | Sako et al. ........................... 371/39 |
| 4,476,562 | 10/1984 | Sako et al. .......................... 371/39 |

Primary Examiner—Charles E. Atkinson
Attorney, Agent, or Firm—Sughrue, Mion, Zinn, Macpeak and Seas

[57] ABSTRACT

In a decoder responsive to a sequence of interleaved codes and comprising a syndrome generator (20) and a calculating circuit (10) cooperating with the syndrome generator, the interleaved code sequence is reproduced into first and second reproduced sequence which are subjected to first and second error corrections by the use of the syndrome generator and the calculating circuit with reference to check codes included in each reproduced sequence. When the syndrome generator is put into operation for one of the first and the second error corrections, the calculating circuit is operated for the other. Thus, the first and the second error corrections are alternatingly carried out in each of the syndrome generator and the calculating circuit. Preferably, each of the first and the second reproduced sequence is of Reed-Solomon codes.

6 Claims, 7 Drawing Figures

|    | $ch_1$ | $ch_2$ | $ch_3$ |     | $ch_u$ | $ch_{u+1}$ | $ch_{u+2}$ | $ch_{u+3}$ | $ch_{u+4}$ |
|----|--------|--------|--------|-----|--------|------------|------------|------------|------------|
| $BL_0$ | $w_0$ | $w_1$ | $w_2$ | --- | $w_{u-1}$ | $P_{01}$ | $P_{02}$ | $P_{03}$ | $P_{04}$ |
| $BL_1$ | $w_u$ | $w_{u+1}$ | $w_{u+2}$ | --- | $w_{2u-1}$ | $P_{11}$ | $P_{12}$ | $P_{13}$ | $P_{14}$ |
| $BL_2$ | $w_{2u}$ | $w_{2u+1}$ | $w_{2u+2}$ | --- | $w_{3u-1}$ | $P_{21}$ | $P_{22}$ | $P_{23}$ | $P_{24}$ |

FIG. 3

| | | | | | | | | | |
|---|---|---|---|---|---|---|---|---|---|
| $F_0$ | $w_0$ | | | | | | $Q_{01}$ | $Q_{02}$ | $Q_{03}$ | $Q_{04}$ |
| $F_1$ | $w_u$ | $w_1$ | | | | | $Q_{11}$ | $Q_{12}$ | $Q_{13}$ | $Q_{14}$ |
| $F_2$ | | $w_{u+1}$ | $w_2$ | | | | $Q_{21}$ | $Q_{22}$ | $Q_{23}$ | $Q_{24}$ |
| $F_{u-1}$ | | | | $w_{u-1}$ | | | $Q_{u-1,1}$ | $Q_{u-1,2}$ | $Q_{u-1,3}$ | $Q_{u-1,4}$ |
| $F_u$ | | | | $w_{2u-1}$ | $P_{01}$ | | $Q_{u,1}$ | $Q_{u,2}$ | $Q_{u,3}$ | $Q_{u,4}$ |
| $F_{u+1}$ | | | | $P_{11}$ | $P_{02}$ | | $Q_{u+1,1}$ | $Q_{u+1,2}$ | $Q_{u+1,3}$ | $Q_{u+1,4}$ |
| $F_{u+2}$ | | | | $P_{12}$ | $P_{03}$ | | $Q_{u+2,1}$ | $Q_{u+2,2}$ | $Q_{u+2,3}$ | $Q_{u+2,4}$ |
| $F_{u+2}$ | | | | $P_{13}$ | $P_{04}$ | $Q_{u+3,1}$ | $Q_{u+3,2}$ | $Q_{u+3,3}$ | $Q_{u+3,4}$ |
| $F_{u+4}$ | | | | | $P_{14}$ | $Q_{u+4,1}$ | $Q_{u+4,2}$ | $Q_{u+4,3}$ | $Q_{u+4,4}$ |

METHOD CAPABLE OF SIMULTANEOUSLY DECODING TWO REPRODUCED SEQUENCES

BACKGROUND OF THE INVENTION

This invention relates to a method of decoding a sequence of interleaved codes formed by Reed-Solomon codes which belong to Bose-Chaudhuri-Hocquenghem (BCH) codes. Although the following description will be restricted to the Reed-Solomon codes by way of example, it should be noted throughout the instant specification that this invention is applicable to the other BCH codes.

It is a recent trend that such an interleaved code sequence is used to record an audio signal subjected to pulse code modulation (PCM), on a recording medium, such as a video tape, a magnetic disk, a compact disk, or the like. As will later be described with reference to a few figures of the accompanying drawing, the interleaved code sequence is produced from a sequence of data words in a predetermined manner. More particularly, each of several blocks is at first formed by dividing the data word sequence into a succession of primary sets and by adding each primary set to a primary check word determined by each primary set. Thereafter, the interleaved code sequence is produced by giving different delays to the data words and the first check code of each block to form a succession of secondary sets and by adding each of the secondary sets to a secondary check word determined by each secondary set. Each block and each interleaved code are usually formed by Reed-Solomon codes which are powerful against random errors. As a result, such an interleaved code sequence becomes strong against both random errors and burst errors, as is known in the art.

On decoding the interleaved code sequence, first and second error corrections are successively made by the use of reproductions of the secondary check word and the primary check word. Each of the first and the second error corrections is specified by a series of operations. In order to reproduce the primary check word, each block should be reconstructed from the interleaved code sequence. For this purpose, the interleaved code sequence is subjected to a plurality of delays to adjust the different delays given to the data words and the first check code.

The second error correction should be made after a series of operations is completed for the first error correction. Otherwise, there is the probability that the same data word will be corrected twice to be rendered into an error in the first and the second error corrections. Therefore, the second error correction should independently be carried out after the first error correction. As a result, it takes a long time to carry out the first and the second error corrections. In order to carry out such first and second error corrections within a short time, a complicated algorithm should be used.

SUMMARY OF THE INVENTION

It is an object of this invention to provide a method which is capable of rapidly decoding an interleaved code sequence.

It is another object of this invention to provide a method of the type described, in which a first error correction based on a secondary check code can be carried out substantially simultaneously with a second error correction based on a primary check code.

It is a further object of this invention to provide a method of the type described, wherein error correction can be accomplished by the use of a simple algorithm.

This invention is applicable for decoding a sequence of interleaved codes in a decoder comprising first means for diagnosing said interleaved code sequence to produce results of diagnosis and second means cooperating with the first means for carrying out calculation in a Galois field with reference to the results of diagnosing. The interleaved code sequence is produced by dividing a sequence of data signals into a sequence or primary sets, arranged the primary sets into a sequence of blocks together with a plurality of primary check signals determined by the respective primary sets, rearranging the blocks into a sequence of secondary sets by giving a plurality of interleaving delays to the data signals and the primary check signal of each block, and arranging the secondary sets into the interleaved codes by adding the secondary sets to a plurality of secondary check signals determined by the respective secondary sets. The method comprises the steps of reproducing each of the secondary sets and each of the secondary check signals from the interleaved code sequence to make a first error correction with reference to each of the reproduced secondary check signals and reproducing each of the primary sets and each of the primary check signals from each of the reproduced secondary sets by providing a plurality of decoding delays in consideration of the interleaving delays, to make a second error correction with reference to each of the reproduced primary check signals.

According to this invention, the method comprises the steps of putting the first means into operation for one of the first and the second error corrections while the second means is operated for the other, so that each of the first and the second means alternatingly carries out the first and the second error corrections.

DESCRIPTION OF THE PREFERRED EMBODIMENTS

(I) Algorithm

It is known that the Reed-Solomon codes are strongest against random errors among the known error correcting codes. In order to decode the Reed-Solomon code, calculation should be carried out in a Galois field. Such calculation is possible by making use of a vector and a cyclic group representation.

Vector representation of the Galois field

Let the Galois field GF(2) be considered as an example of the various Galois fields. Only two elements of "0" and "1" are present in the Galois field GF(2) under consideration. An irreducible polynomial F(x) is defined which has a degree of m and no root in the Galois field GF(2). Consideration is given to a hypothetical root $\alpha$ which satisfies $F(x)=0$ in order to extend GF(2) to GF($2^m$) which is called a Galois extension. The Galois extension GF($2^m$) is formed by elements which are equal in number to $2^m$ and which are represented by 0, $\alpha, \alpha^2, \alpha^3, \ldots, \alpha^{m-1}$, in the manner well known in the art. The Galois extension GF($2^m$) may be referred to as a polynomial ring modulo that irreducible polynomial F(x) of m-degree which is defined in the Galois field GF(2). Each element of the Galois extension GF($2^m$) can be represented by a linear combination of 1, $\alpha = \{x\}$, $\alpha^2 = \{x^2\}, \ldots, \alpha^{m-1} = \{x^{m-1}\}$. Namely, $$a_0 + a_1\{x\} + a_2\{x^2\} + \ldots + a_{m-1}\{x^{m-1}\} = a_0 + a_1\alpha + a_2\alpha^2 + \ldots + a_{m-1}\alpha^{m-1}, \quad (1)$$

where each of $a_0, a_1, \ldots, a_{m-1}$ is an element of the Galois field GF(2). The expression (1) is often written simply as:

$$(a_0, a_1, a_2, \ldots, a_{m-2}, a_{m-1})$$

or $$(a_{m-1}, a_{m-2}, \ldots, a_2, a_1, a_0). \quad (2)$$

Each of the expressions (1) and (2) is called a vector representation. As the Galois extension GF($2^m$), GF($2^8$) will be exemplified which has an irreducible polynomial F(x) given by:

$$F(x) = x^8 + x^4 + x^3 + x^2 + 1.$$

In this event, each datum of eight bits is represented by the vector representation either as:

$$a_7x^7 + a_6x^6 + a_5x^5 + a_4x^4 + a_3x^3 + a_2x^2 + a_1x^1 + a_0$$

or as:

$$(a_7, a_6, a_5, a_4, a_3, a_2, a_1, a_0).$$

Cyclic group representation

The exemplified Galois extension GF($2^8$) can be expressed by the cyclic group representation which utilizes the fact that all of the elements except the zero element of GF($2^8$) form a multiplicative group having an order of ($2^m - 1$). Each of the elements of GF($2^8$) is given by the use of the cyclic group representation by:

$$0, 1(=\alpha^{2^m-1}), \alpha, \alpha^2, \ldots, \alpha^{2^m-2}.$$

Thus, the cyclic group representation expresses each element except the zero element in an index fashion and may therefore be called an index representation.

It is assumed that one block of n words is formed by the Reed-Solomon codes and includes check words, k, in number. In this event, a parity check matrix H is given by:

$$H = \begin{bmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \vdots & \vdots & & \vdots & \vdots \\ \alpha^{(k-1)(n-1)} & \alpha^{(k-1)(n-2)} & \ldots & \alpha^{k-1} & 1 \end{bmatrix} \quad (3)$$

Let a code word matrix V be given by:

$$V = (w_{n-1}, w_{n-2}, \ldots, w_1, w_0) \quad (4)$$

In the code word matrix, data words and check words are equal in number to (n−k) and k, respectively.

If no error pattern takes place in each of the data and the check words, the following equation holds:

$$HV^T = 0, \quad (5)$$

where $V^T$ represents a transposed matrix.

When the Galois extension GF($2^m$) is the above-exemplified Galois extension GF($2^8$), the Reed-Solomon code has the check codes equal in number to four. The parity check matrix H is therefore rewritten into:

$$H = \begin{bmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \alpha^{3(n-1)} & \alpha^{3(n-2)} & \ldots & \alpha^3 & 1 \end{bmatrix} \quad (6)$$

It is assumed that a received single block is specified by:

$$\hat{V} = [\hat{w}_{n-1}, \hat{w}_{n-2}, \ldots, \hat{w}_1, \hat{w}_0],$$

when $\hat{V}$ represents a row vector and $\hat{w}_i$ is given by:

$$\hat{w}_i = w_i \oplus e_i,$$

where, in turn, $e_i$ represents an error pattern and an encircled plus sign, exclusive OR. In this event, four syndromes $S_0, S_1, S_2, S_3$ appear at a received end in dependence upon the error pattern and are given by:

$$\begin{bmatrix} S_0 \\ S_1 \\ S_2 \\ S_3 \end{bmatrix} = H\hat{V}. \quad (7)$$

With the Reed-Solomon codes, it is possible to correct up to two-word errors in the block and to correct three or four word errors if an error location is found out, as is known in the art.

Error Correcting Operation

As will be described below, each received block $\hat{V}$ formed by the Reed-Solomon codes can be corrected through the first to the fourth steps (i) to (iv) and be decoded into a reproduced block.
(i) The syndromes $S_0$ to $S_3$ are calculated from each received block;
(ii) The number of word errors is detected;
(ii) Error locations are calculated; and (iv) The errors are corrected after calculation of an error pattern.

First Step (i)

The above-mentioned four syndromes $S_0$ through $S_3$ are defined by:

$$\begin{aligned} S_0 &= \hat{w}_{n-1} + \hat{w}_{n-2} + \ldots + \hat{w}_0, \\ S_1 &= \alpha^{n-1}\hat{w}_{n-1} + \alpha^{n-2}\hat{w}_{n-2} + \ldots + \hat{w}_0, \\ S_2 &= \alpha^{2(n-1)}\hat{w}_{n-1} + \alpha^{2(n-2)}\hat{w}_{n-2} + \ldots + \hat{w}_0, \\ \text{and } S_3 &= \alpha^{3(n-1)}\hat{w}_{n-1} + \alpha^{3(n-2)}\hat{w}_{n-2} + \ldots + \hat{w}_0, \end{aligned} \quad (8)$$

respectively. When the syndromes $S_0$ to $S_3$ are calculated in accordance with Formula (8), the first step (i) is followed by the second step (ii).

Second Step (ii)

The second step (ii) is for determining the number of word errors by the use of an error location polynomial $\sigma(x)$ which is known in the art and which is specified by:

$$\sigma(x) = x^e + \sigma_1 x^{e-1} + \ldots + \sigma_e, \quad (9)$$

where e represents the number of the word errors and the coefficients $\sigma_i$ are related to the syndrome $S_i$ by the following equations:

$$S_{i+e} + \sigma_1 S_{i+e-1} + \ldots + \sigma_{e-1} S_{i+1} + \sigma_e S_i = 0, \quad (10)$$

where $0 \leq i \leq 3$.

It is possible to determine the number e of the word errors by the use of Equation (10) in the manner described below.

If $e=0$, $S_i=0$ and, therefore:

$$S_0 = S_1 = S_2 = S_3 = 0. \quad (10a)$$

If $e=1$, Equation (10) is rewritten into:

$$S_{i+1} + \sigma_1 S_i = 0. \quad (10b)$$

Substitution of "0", "1", "2", and "3" into Equation (10b) gives:

$$\left. \begin{aligned} S_1 + \sigma_1 S_0 &= 0, \\ S_2 + \sigma_1 S_1 &= 0, \\ \text{and } S_3 + \sigma_1 S_2 &= 0. \end{aligned} \right\} \quad (10c)$$

If $e=2$, Equation (10) is rewritten in a similar manner into:

$$\left. \begin{aligned} S_2 + \sigma_1 S_1 + \sigma_2 S_0 &= 0 \\ \text{and } S_3 + \sigma_1 S_2 + \sigma_2 S_1 &= 0. \end{aligned} \right\} \quad (10d)$$

The syndromes $S_0$ to $S_3$ can also be represented by the use of Equation (1). In this event, if $e=1$, the syndromes $S_0$ to $S_3$ result in:

$$S_0 = e_i,$$

$$S_1 = e_i \alpha^i,$$

$$S_2 = e_i \alpha^{2i},$$

and $$S_3 = e_i \alpha^{3i}.$$

Similarly, if e is equal to 2 and the word errors occur at i-th and j-th words in the block, the syndromes $S_0$ to $S_3$ are given by:

$$S_0 = e_i + e_j,$$

$$S_1 = e_i \alpha^i + e_j \alpha^j,$$

$$S_2 = e_i \alpha^{2i} + e_j \alpha^{2j},$$

and $$S_3 = e_i \alpha^{3i} + e_j \alpha^{3j}.$$

The following conclusions (1) through (3) can be derived from Equations (10a), (10c), and (10d).

(1) If at least one of $S_0$ to $S_3$ is not equal to zero, at least one word error is present in the received block.

(2) If a single word error occurs, $S_0 \neq 0$, $S_1 \neq 0$, $S_2 \neq 0$, and $S_3 \neq 0$. Moreover, Equations (10c) give:

$$S_1/S_0 = S_2/S_1 = S_3/S_2. \quad (11)$$

Therefore, the following equations hold:

$$\left. \begin{aligned} S_1^2 + S_2 S_0 &= 0, \\ S_2^2 + S_1 S_3 &= 0, \\ \text{and } S_1 S_2 + S_0 S_3 &= 0. \end{aligned} \right\} \quad (12)$$

(3) If a double word error occurs, Equations (12) never hold. Namely, $$\left. \begin{aligned} S_1^2 + S_0 S_2 &= A \neq 0, \\ S_2^2 + S_1 S_3 &= B \neq 0, \\ \text{and } S_1 S_2 + S_0 S_3 &= C \neq 0. \end{aligned} \right\} \quad (13)$$

At any rate, the number e of the word errors can be detected in the second step (ii) in the above-mentioned manner.

Third Step (iii)

In the third step (iii), the word error or errors are located by the use of the error location polynomial (9) in a manner which will be described below.

If $e=1$, the polynomial (9) is rewritten in consideration of Equation (11) into:

$$\begin{aligned} \sigma(x) &= x + \sigma_1 \\ &= x + (S_1/S_0). \end{aligned} \quad (14)$$

If $e=2$, the polynominal (9) is similarly rewritten into:

$$\sigma(x) = x^2 + \sigma_1 x + \sigma_2. \quad (15)$$

From Equations (10d) and (13), the coefficients $\sigma_1$ and $\sigma_2$ are represented by:

$$\begin{aligned} \sigma_1 &= B/A \\ \text{and } \sigma_2 &= C/A. \end{aligned} \quad (16)$$

Therefore, substitution of Equations (16) into Equation (15) gives:

$$Ax^2 + Bx + C = 0. \quad (17)$$

Roots of Equations (14) and (17) can simply be calculated by the use of Chien's algorithm in a manner to be described later. Anyway, the word error or errors are located in the third step (iii).

Fourth Step (iv)

The error pattern is determined by the syndromes in the following manner to be corrected.

If $e=1$, the error pattern is specified by:

$$e_i S_0. \quad (18)$$

Therefore, error correction is possible by setting:

$$w_i = \hat{w}_i + e_i. \quad (19)$$

If $e=2$, the error pattern is specified by:

$$e_i + e_j = S_0$$

and $$e_i \alpha^i + e_j \alpha^j = S_i.$$

Therefore, each error is given by:

$$\begin{aligned} e_i &= (\alpha^j S_0 + S_1)/(\alpha^i + \alpha^j) = (\alpha^j S_0 + S_1)/\sigma_1 \\ \text{and } e_j &= S_0 + e_i. \end{aligned} \quad (20)$$

Thus, error correction is made by setting:

$$\begin{aligned} w_i &= \hat{w}_i + e_i \\ \text{and } w_j &= \hat{w}_j + e_j. \end{aligned} \quad (21)$$

(II) Interleaved Code Sequence

Figure 1:
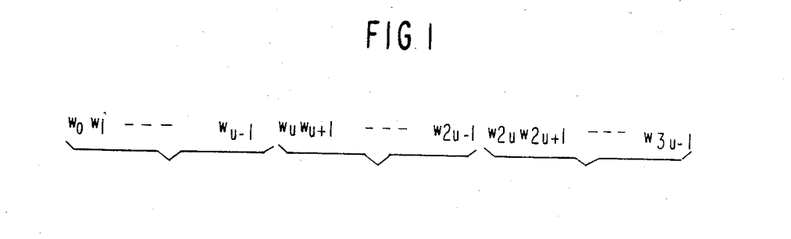
FIG. 1 shows a view for describing an arrangement of primitive data words.
Figure 2:
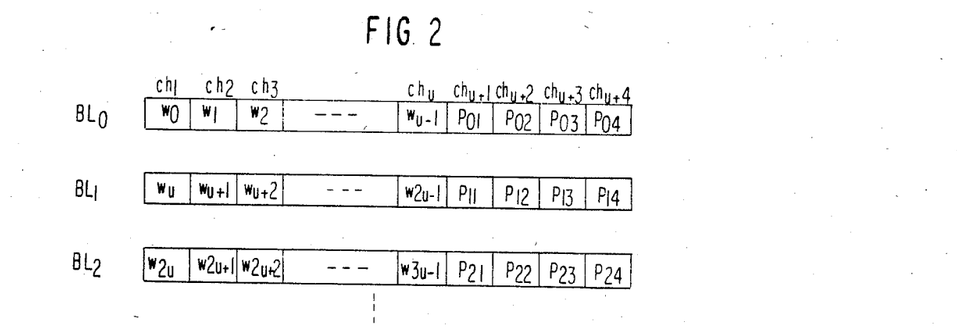
FIG. 2 shows a view for describing a sequence of blocks produced by arranging the primitive data words illustrated in FIG. 1.
Figure 3:
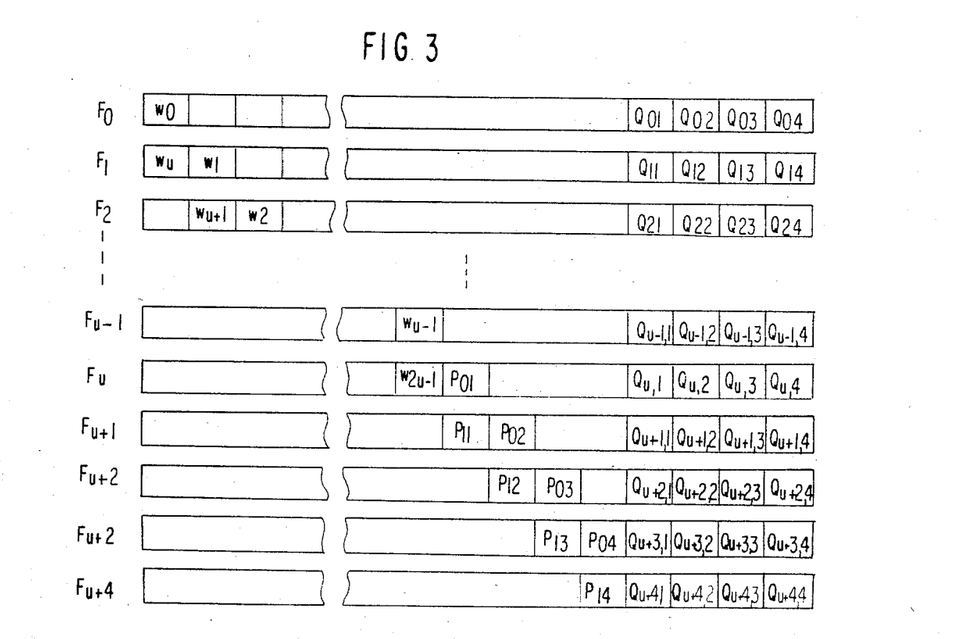
FIG. 3 shows a view for describing a sequence of interleaved codes produced by rearranging the block sequence illustrated in FIG. 2.

Referring to FIGS. 1 through 3, an interleaved code sequence will be described for a better understanding of this invention. In FIG. 1, a succession of primitive data words $w_0, w_1, \ldots, w_{3u-1}$ is produced as a pulse code modulation (PCM) signal from an analog-to-digital converter (not shown) and is divisible into a succession of primary sets each of which consists of a predetermined number $u$ of primitive words $(w_0, w_1, \ldots, w_{u-1})$, $(w_u, w_{u+1}, \ldots, w_{2u-1})$, $(w_{2u}, w_{2u+1}, \ldots, w_{3u-1})$.

The predetermined number $u$ is determined in consideration of the number $k$ of the check words and the Galois extension $GF(2^m)$ and may be, for example, 24 or the like. In FIG. 2, the primary sets are arranged into a succession of blocks $BL_0, BL_1, \ldots$ together with primary check codes determined by the respective primary sets. Each primary check code consists of four words $(P_{01}, P_{02}, P_{03}, P_{04})$, $(P_{11}, P_{12}, P_{13}, P_{14})$, ... because the number $k$ of the check words is equal to four. Thus, each block has a first through a $(u+4)$-th word arranged from left to right of FIG. 2. Let the first through the $(u+4)$-th words of the respective blocks $BL_0, BL_1, \ldots, BL_j$ be placed in first through $(u+4)$-th channels $Ch_1$ to $Ch_{u+4}$, respectively. It is assumed that each block is formulated by Reed-Solomon codes as mentioned before.

In FIG. 3, each of the blocks illustrated in FIG. 2 is rearranged into a succession of secondary sets by providing a plurality of delays to the data words and the primary check word of each block, respectively. More particularly, the first words $w_0, w_u, w_{2u}, \ldots$ in the first channel $Ch_1$ are not delayed while the second words $w_1, w_{u+1}, \ldots$ in the second channel $Ch_2$ are delayed a duration of a single block, two blocks, or the like. Likewise, the words in the third through the $(u+4)$-th channels $Ch_3$ to $Ch_{u+4}$ are delayed durations of two to $(u+3)$ blocks, respectively. Thus, first through $(u+4)$-th ones of the secondary sets are formed as shown in FIG. 3.

Thereafter, first through $(u+4)$-th secondary check codes are determined by and added to the first through the $(u+4)$-th secondary sets, respectively. Each secondary check code consists of four words, such as $Q_{01}, Q_{02}, Q_{03}, Q_4; Q_{11}, Q_{12}, Q_{13}, Q_{14}; \ldots; Q_{u+4,1}, Q_{u+4,2}, Q_{u+4,3}, Q_{u+4,4}$, as is the case with each primary check word. First through $(u+4)$-th frames $F_0$ to $F_{u+4}$ are thereby formed as illustrated in FIG. 3. Although the first words $w_0$ to $w_{2u-1}$ and the primary check words $P_{01}$ to $P_{14}$ in the first and the second blocks $BL_0$ and $BL_1$ are illustrated in the first through the $(u+4)$-th frames $F_0$ to $F_{u+4}$, the remaining portions of each frame are filled as each secondary set with data words and primary check words included in the preceding and the succeeding blocks. As a result, each combination of each secondary set with a secondary check code added thereto is produced as the interleaved code sequence and is a Reed-Solomon code as mentioned before. Such a combination may be referred to as an interleaved code arranged in each frame. Thus, the interleaved code sequence is a resultant sequence of the interleaved codes.

(III) Preferred Embodiment

Figure 4:
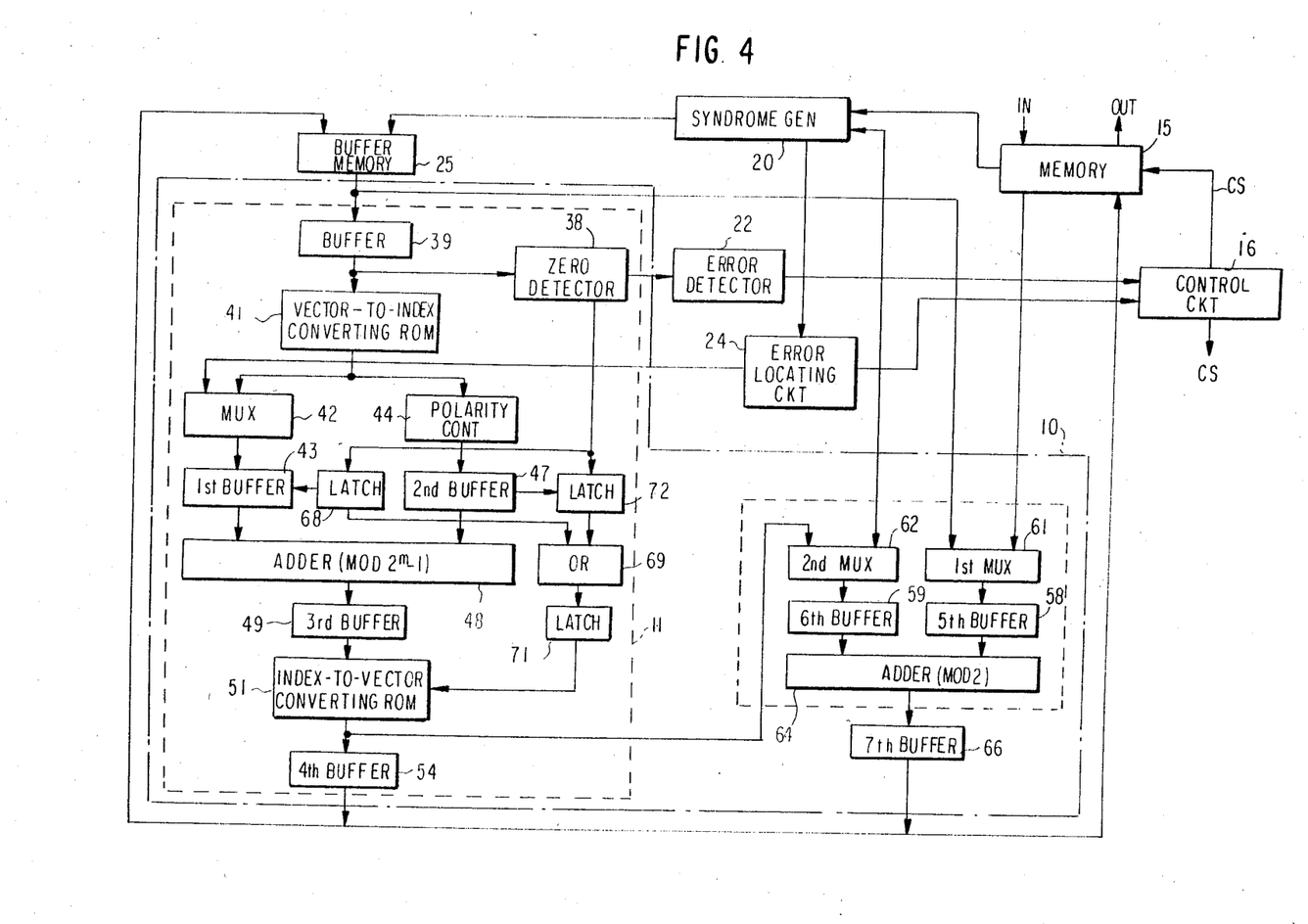
FIG. 4 shows a block diagram of a decoder according to an embodiment of this invention.

Referring to FIG. 4, a decoder to which this invention is applicable is for use in decoding the interleaved code sequence formed by the Reed-Solomon codes as mentioned in conjunction with FIG. 3. The interleaved code sequence is divisible into a plurality of frames each of which is composed of $(u+8)$ words including four check words. In the illustrated decoder, the interleaved code sequence, namely, the resultant sequence is at first processed to produce a processed sequence of reproductions of the respective interleaved codes. The processed sequence and the reproductions may be called a first reproduced sequence and reproduced interleaved codes, respectively. In this event, a first error correction is made to correct, with reference to the secondary check code of four words (illustrated in FIG. 3) of each reproduced interleaved code, at least one error word which might be introduced into the secondary set of each reproduced interleaved code between encoding and decoding.

In the decoder, the first reproduced sequence, namely, the processed sequence is further processed to produce a further processed sequence of reproductions of the respective blocks (shown at $BL_0, BL_1, \ldots$ in FIG. 2). The further processed sequence and the reproductions of the respective blocks may be referred to as a second reproduced sequence and reproduced blocks, respectively. The second reproduced sequence can be produced by providing a plurality of decoding delays to the first through the u-th words ($w_0, w_1, \ldots, w_{u-1}$; $P_{01} \sim P_{04}$) (illustrated in FIG. 3) of the secondary set of the first reproduced sequence. For example, the first word of each frame is subjected to a first one of the decoding delays that is equal to $(u+4)$ unit delays while the second word is subjected to a second one of the decoding delays that is equal to $(u+3)$ unit delays. Likewise, the third through the u-th words are given third through u-th ones of the decoding delays that are equal to durations of $(u+2)$ to five unit delays, respectively. The four check words of each primary check code are also subjected to four to one unit delays. As a result, the reproduced blocks are formed as shown in FIG. 2.

A second error correction is made to correct, with reference to the primary check code of each reproduced block, at least one error which might be introduced into the primary set of each reproduced block.

The illustrated decoder is for substantially simultaneously carrying out the first and the second error corrections. More specifically, the illustrated divider can be divided into a calculating circuit 10 for carrying out calculation in a Galois field and the remaining circuit as will later be described. The calculating portion 10 comprises a first part 11 for carrying out multiplication and division in $GF(2^m)$ and a second part 12 for carrying out addition in $GF(2^m)$. It is to be noted here that the index representation mentioned in the item I is used in the first part 11 for the multiplication and the division while the vector representation is used in the second part 12 for the addition. In addition, subtraction in $GF(2^m)$ is identical with the addition in $GF(2)$.

The calculating circuit 10 operates in the second and the fourth steps (ii) and (iv) mentioned before, so as to carry out calculations shown by the formulae (13), (19), (20), and (21) in a manner to be described later.

The remaining circuit comprises a memory 15 having a plurality of addresses for storing the interleaved code sequence IN to produce a sequence of decoded or error corrected output codes OUT and a control circuit 16 for producing various kinds of control signals collectively denoted at CS. The remaining circuit further comprises a syndrome generator 20 (as will later be described in detail), an error detector 22 for detecting the number of each word error in the second step (ii), an error locating circuit 24 operatively coupled to the first part 11 and the syndrome generator 20 for locating each word error, and a buffer memory 25 coupled to the syndrome generator 20. The illustrated memory 16 cooperates with the syndrome generator 20 and the calculating circuit 10 under control of the control circuit 16.

The syndrome generator 20 is for diagnosing the interleaved code sequence to produce results of diagnosis, such as $S_0$ to $S_3$ and the like. More specifically, the syndrome generator 20 is operable to calculate the syndromes $S_0$, $S_1$, $S_2$, and $S_3$ in the first step (i) and to locate each word error in accordance with the Chien's algorithm in the third step (iii), as will presently become clear. On the other hand, the calculating circuit 10 operates in the second and the fourth steps (ii) and (iv).

Moreover, each of the first and the second error corrections is specified by a series of operations, namely, the first through the fourth steps (i) to (iv) and may be made in a similar manner in the syndrome generator 20 and the calculating circuit 10.

Thus, it has been found that the first through the fourth steps (i) to (iv) relating to each of the first and the second error corrections can partially an individually be carried out, as long as each step is not superposed on the other steps.

Under the circumstances, it is possible to alternatingly operate the syndrome generator 20 and the calculating circuit 10, if the first error correction is partially finished upon execution of the second error correction. In other words, operations for the first and the second corrections may be interlaced in each of the syndrome generator 20 and the calculating circuit 10. In order to accomplish such interlaced operation between the first and the second corrections, a common delay is given to the primary set in each of the reproduced blocks and to the primary check code in each reproduced block. Such a common delay may be for establishing each result of the first error correction.

In operation, the reproduced interleaved code sequence IN is successively stored in the memory 15 at every frame. As illustrated in FIG. 3, each frame comprises the secondary set and the secondary check code. The secondary set and the secondary check code are sent to the syndrome generator 20.

Figure 5:
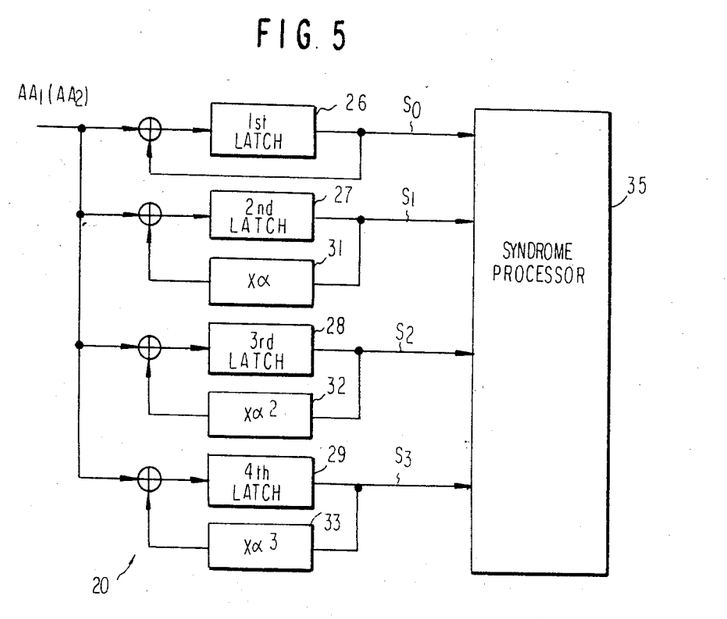
FIG. 5 shows a block diagram of a syndrome generator for use in the decoder illustrated in FIG. 4.
Figure 6:
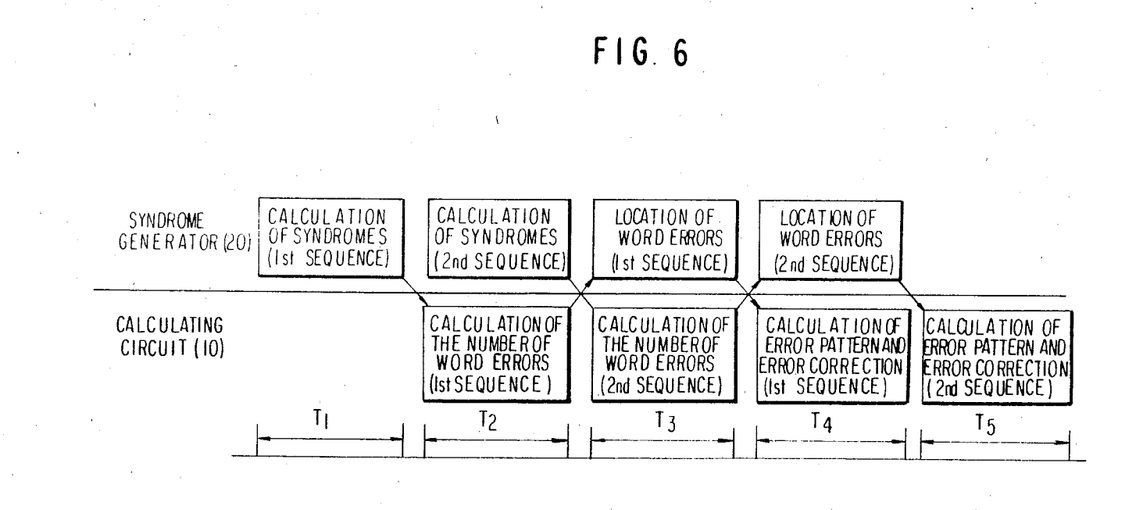
FIG. 6 shows a time chart for describing operation of the decoder illustrated in FIG. 4.

Referring to FIGS. 5 and 6 afresh and FIG. 4 again, the syndrome generator 20 comprises first, second, third, and fourth latches 26, 27, 28, and 29 responsive to the first reproduced sequence (depicted at $AA_1$) for calculating the syndromes $S_0$, $S_1$, $S_2$, and $S_3$ of the first reproduced sequence in accordance with the formulae (8), respectively. The first through the fourth latches 26 to 29 are initially put into reset states. Under the circumstances, the first reproduced sequence $AA_1$ is successively kept as each word $\hat{w}_{n-1}, \hat{w}_{n-2}, \ldots, \hat{w}$ of the received block in the first through the fourth latches 26 to 29 through Exclusive OR gates which are supplied with outputs of the latches 26 to 29 directly and through first through third multipliers 31 to 33, respectively. The first through the third multipliers 31 to 33 multiply the outputs of the latches 26 to 29 by the factors $\alpha$, $\alpha^2$, and $\alpha^3$, respectively.

With this structure, the first one ($\hat{w}_{n-1}$) of the words is at first stored in each of the first through the fourth latches 26 to 29. When the second one ($\hat{w}_{n-2}$) is given to the syndrome circuit 20, the first through the fourth latches 26 to 29 store $\hat{w}_{n-1}+\hat{w}_{n-2}$; $\alpha\hat{w}_{n-1}+\hat{w}_{n-2}$; $\alpha^2\hat{w}_{n-1}+\hat{w}_{n-2}$; and $\alpha^3\hat{w}_{n-1}+\hat{w}_{n-2}$, respectively. Likewise, the syndromes $S_0$ to $S_3$ can be calculated in compliance with the formulae (8) and are sent to a syndrome processor 35. Such calculation of the syndromes lasts a first time interval $T_1$ as shown in FIG. 6. Thereafter, the syndromes $S_0$ to $S_3$ of the first reproduced sequence $AA_1$ are transferred from the syndrome processor 35 to the buffer memory 25. As a result, operation of the first reproduced sequence $AA_1$ is taken over by the calculating circuit 10. Thus, the first step (i) is completed in connection with the first reproduced sequence $AA_1$.

When the syndromes $S_0$ to $S_3$ of the first reproduced sequence $AA_1$ are stored in the buffer memory 25 after calculation of the syndromes in question, the second reproduced sequence (depicted at $AA_2$ in FIG. 5) is read out of the memory 15 under control of the control circuit 16. For example, the first block $BL_0$ illustrated in FIG. 2 is sent as one of the reproduced blocks to the syndrome generator 20. The syndromes $S_0$ to $S_3$ are calculated by the syndrome generator 20 during a second time interval $T_2$ (FIG. 6), as in the case with the first reproduced sequence $AA_1$. Anyway, the second reproduced sequence $AA_2$ is given the common delay relative to the first reproduced sequence $AA_1$.

During the second time interval $T_2$, the calculating circuit 10 is operated in response to the syndromes $S_0$ to $S_3$ of the first reproduced sequence $AA_1$ to calculate A, B, and C in accordance with the formulae (13). Such calculation is performed in the Galois extension $GF(2^8)$ in the illustrated calculating circuit 10. As mentioned before, the first part 11 serves to carry out multiplication and division in $GF(2^8)$ by the use of the index representation. It is mentioned here that zero cannot be expressed by the index representation. On the other hand, each input of the first part 11 is expressed by the vector representation and often takes a zero value. For example, zero appears as each of the syndromes $S_0$ to $S_3$, as indicated in the formula (10a), and is therefore significant. Taking this into consideration, a zero detector 38 is included in the first part 11 to detect zero.

Each of the syndromes $S_0$ to $S_3$ of the first reproduced sequence $AA_1$ is sent from the buffer memory 25 to the zero detector 38 through a buffer 39. Let a product of $S_0S_2$ be calculated by the first part 11 on condition that each of $S_0$ and $S_2$ is not equal to zero. The syndrome $S_0$ is given to a vector-to-index converting ROM (read-only memory) 41 for converting the syndrome $S_0$ of the vector representation into that of the index representation. The converted syndrome $S_0$ is moved through a multiplexer 42 to a first buffer 43. The other syndrome $S_2$ is moved from the buffer 39 through a polarity controller 44 to a second buffer 47.

The polarity controller 44 is operable on carrying out division to provide the one's complement of an input supplied thereto. This is because the division can be replaced by multiplication by the use of the one's complement, as is known in the art.

As to the above-mentioned multiplication of $S_0S_2$, the converted syndromes $S_0$ and $S_2$ are sent to an adder (mod $2^m-1$, namely, mod 255) 48 for carrying out addition mode 255 to calculate a sum. It is needless to say that the addition in the index representation corresponds to multiplication in the vector representation. The sum is supplied through a third buffer 49 to an index-to-vector converting ROM 51 to be converted into a converted sum of the vector representation. The converted sum is sent through a fourth buffer 54 to the buffer memory 25.

It is assumed that a square of the syndrome $S_1$ is calculated by the first part 11 in the above-mentioned manner. Under the circumstances, a sum of $S_1^2$ and $S_0S_2$ should be given to calculate A. To this end, the second part 12 is operable in a manner described below. Let $S_0S_2$ and $S_1^2$ be supplied from the buffer memory 25 and the index-to-vector converting ROM 51. In this event, fifth and sixth buffers 58 and 59 are loaded with the product $S_0S_2$ and the square $S_1^2$ through first and second multiplexers 61 and 62, respectively. An adder (mod 2) 64 carries out addition mod 2 to calculate A as a result of addition. The result A is moved through a seventh buffer 66 to the buffer memory 25.

Similarly, B and C can be calculated in accordance with the formulae (13) to be produced as results of calculation.

Let the syndrome $S_0$ be equal to zero and the first buffer 43 be loaded with zero corresponding to the syndrome $S_0$. In this case, the zero detector 38 sends a logic "1" level signal through a latch 68, an OR gate 69, and a latch 71 to the ROM 51 to reset an output signal of the ROM 51. As a result, the fourth buffer 54 is loaded with zero. When the second buffer 47 is loaded with zero, the zero detector 38 supplies the logic "1" level signal as the reset signal through a latch 72 to the ROM 51. At any rate, the fourth buffer 54 is provided with zero when at least one of the syndromes to be multiplied is equal to zero.

The results A, B, and C of calculation are delivered from the buffer memory 25 through the buffer 39 and the zero detector 38 to the error detector 22 together with the syndromes $S_0$ to $S_3$.

Figure 7:
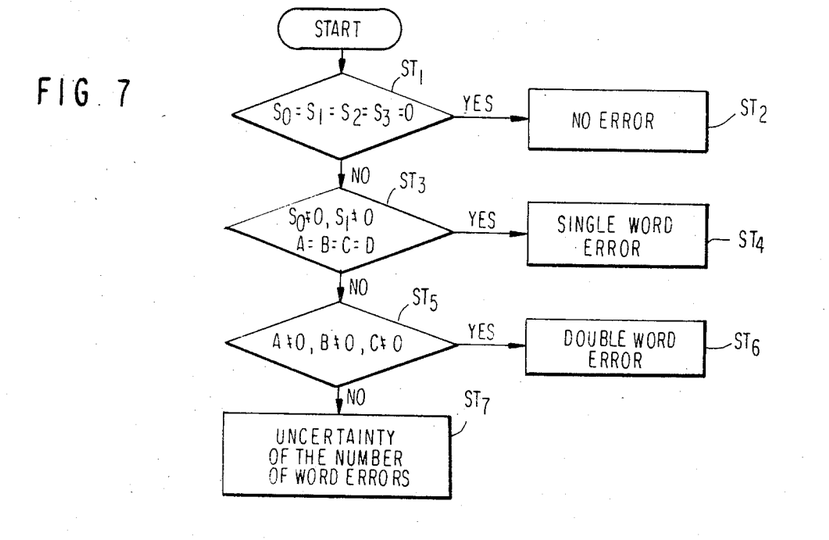
FIG. 7 shows a flow chart for describing operation of an error detector for use in the decoder illustrated in FIG. 4.

Temporarily referring to FIG. 7, the error detector 22 is at first supplied with the syndromes $S_0$ to $S_3$. If all of the syndromes $S_0$ to $S_3$ are equal to zero as shown at the first stage $ST_1$, the error detector 22 judges that no error has occurred in the first reproduced sequence $AA_1$, as illustrated at the second stage $ST_2$. When the syndromes $S_0$ and $S_1$ are not equal to zero and the results A, B, and C are equal to zero, as indicated at the third stage $ST_3$, occurrence of a single word error is detected by the error detector 22, as shown at the fourth stage $ST_4$. If all of the results A, B, and C are not equal to zero, as shown at the fifth stage $ST_5$, occurrence of a double word error is estimated by the error detector 22, as seen from the sixth stage $ST_6$. If the number of word errors cannot be decided through the first, the third, and the fifth stages $ST_1$, $ST_3$, and $ST_5$, the error detector 22 judges that the number of word errors is uncertain, as indicated at the seventh stage $ST_7$.

In any event, the error detector 22 supplies the control circuit 16 with an indication relating to the number of word errors. Thus, the second step (ii) is completed in connection with the first reproduced sequence $AA_1$.

Referring back to FIG. 4, the results A, B, and C relating to the first reproduced sequence $AA_1$ are stored in the buffer memory 25 on completion of the second step (ii). The third step (iii) following the second step (ii) is taken over by the syndrome generator 20. On the other hand, the calculating circuit 10 calculates A, B, and C with respect to the second reproduced sequence $AA_2$ in the above-mentioned manner during a third time interval $T_3$ (FIG. 6).

Let any word errors be detected in connection with the first reproduced sequence during the second step (ii). Inasmuch as the results A, B, and C of calculation are kept together with the syndromes $S_0$ to $S_3$ of the first reproduced sequence $AA_1$ in the buffer memory 25, as mentioned before, they are sent to the syndrome generator 20 to locate each word error during the third step (iii).

Referring to FIG. 5, the syndromes $S_0$ and $S_1$ are set in the first and the second latches 26 and 27, respectively, to calculate the root of Equation (14) in accordance with Chien's algorithm when a single error is detected by the error detector 22. Under the circumstances, the first and the second latches 26 and 27 are repeatedly shifted with each input kept at a zero state. According to Chien's algorithm, the location of the single error can be specified by an indication of shift times indicated when Equation (14) holds. The syndrome processor 35 monitors the outputs of the first and the second latches 26 and 27 and the shift times to locate the single error.

When a double word error is detected by the error detector 22, the results A, B, and C are moved from a buffer memory 25 to the third, the second, and the first latches 28, 27, and 26, respectively. The third through the first latches 28 to 26 are repeatedly shifted with the input thereof kept zero until Equation (17) holds. As is the case with the single error, each location of the double error is specified by an indication of shift times produced when Equation (17) holds.

The syndrome generator 20 produces an error location signal representative of each error location. The error location signal is stored in the error locating circuit 24. Thus, the syndrome generator 20 finishes operation for the third step (iii) with respect to the first reproduced sequence $AA_1$.

Thereafter, the fourth step (iv) is carried out in connection with the first reproduced sequence $AA_1$ to correct each word error. For this purpose, an error pattern should be given in accordance with Equations (18) and (20). In the case of the single word error, the syndrome $S_0$ itself specifies the error pattern $e_i$ of the single word error, as seen from Equation (18). Therefore, specific calculation is not necessary to provide the error pattern. In case of a double word error, the error pattern is calculated by the calculating circuit 10 in accordance with Equations (20) in a manner described before and is stored in the buffer memory 25.

Subsequently, the first reproduced sequence $AA_1$ is corrected by the use of the error pattern stored in the buffer memory 25 and the error location signal stored in the error locating circuit 24. To this end, the error location signal is sent from the error locating circuit 24 to the control circuit 16 to access the memory 15. As a result, a word is read out of an address specified by the error location signal to be delivered through the first multiplexer 61 to the fifth buffer 58. On the other hand, the error pattern is moved from the buffer memory 25 through the second multiplexer 62 to the sixth buffer 59. The adder (mod 2) 66 carries out addition in accordance with Equation (19) or (20) to send a result of addition to the memory 15 through the seventh buffer 66. Thus, the error correction is completed in connection with the first reproduced sequence $AA_1$. As shown in FIG. 6, the calculation of each error pattern and the error correction is performed during a fourth time interval $T_4$ by the use of the calculating circuit 10.

During the fourth time interval $T_4$, the syndrome generator 20 locates each word error of the second reproduced sequence $AA_2$ in the manner described in conjunction with the first reproduced sequence $AA_1$.

Thereafter, each word error of the second reproduced sequence $AA_2$ is corrected in the above-mentioned manner during a fifth time interval $T_5$. The error correction of the second reproduced sequence $AA_2$ is carried out after a common delay on completion of the error correction of the first reproduced sequence $AA_1$. For this purpose, the control circuit 16 controls the memory 15 to provide the common delay. Each of the first and the second reproduced sequences which is error-corrected is produced as the output sequence OUT from the memory 15.

With the illustrated decoder, the first and the second reproduced sequence $AA_1$ and $AA_2$ are simultaneously processed in parallel to correct each word error. Therefore, the decoder corrects each word error at a high speed.

While this invention has thus far been described in conjunction with a preferred embodiment thereof, it will readily be possible for those skilled in the art to put this invention into practice in various manners. For example, data words and check words may be replaced by data bits and check bits. A plurality of shift registers may be used to derive the second reproduced sequence from the first reproduced one and to give the common delay.

What is claimed is:

1. A method of decoding a sequence of interleaved codes into a sequence of output codes, said interleaved code sequence being divisible into a succession of frames and rearranged into a succession of blocks, each of said frames including a first sequence of a first data signal set, a first primary check signal set, and a first secondary check signal set while each of said blocks includes a second sequence of a second data signal set and a second primary check signal set which are produced by delaying said first data signal set and said first primary check signal set, respectively, said first and said second sequences being corrected by the use of said first secondary check signal set and said second primary check signal set, respectively, on occurrence of an error in each of said first and said second sequences, said method comprising the steps of:
   successively and alternatingly diagnosing a syndrome of the error in connection with one of said first and said second sequences within a succession of first intervals and diagnosing a syndrome of the error in connection with the other of said first and second sequences within second intervals left between two adjacent ones of said first intervals; and
   successively and alternatingly performing a calculation in a Galois field to correct the error in connection with the other of said first and said second sequences within said first intervals, and performing a calculation in a Galois field to correct the error in connection with the one of said first and second sequences within said second intervals.

2. A method as claimed in claim 1, wherein said interleaved code sequence is represented by the Reed-Solomon codes.

3. A method as claimed in claim 1, wherein said diagnosing step comprises the steps of:
   calculating the syndrome of the error in connection with the one and the other sequences within one of said first intervals and within one of said second intervals, respectively; and
   locating the error in connection with the one and the other sequences within another one of said first intervals and within another one of said second intervals, respectively.

4. A method as claimed in claim 3, wherein said error locating step is carried out by Chien's algorithm.

5. A method as claimed in claim 3, wherein said step of performing a calculation comprises the steps of:
   detecting the number of the error in connection with the one and the other sequences after the syndrome of the error is calculated in said syndrome calculating step; and
   correcting the error in the one and the other sequences after the error is located in said error locating step.

6. A decoder for use in decoding a sequence of interleaved codes into a sequence of output codes, said interleaved code sequence being divisible into a succession of frames and rearranged into a succession of blocks, each of said frames including a first sequence of a first data signal set, a first primary check signal set, and a first secondary check signal set while each of said blocks includes a second sequence of a second data signal set and a second primary check signal set which are produced by delaying said first data signal set and said first primary check signal set, respectively, said first and said second sequences being corrected by the use of said first secondary check signal set and said second primary check signal set, respectively, on occurrence of an error in each of said first and said second sequences, said decoder comprising:

first means for successively and alternatingly diagnosing a syndrome of the error in connection with one of said first and said second sequences within a succession of first intervals and diagnosing a syndrome of the error in connection with the other of said first and second sequences within second intervals left between two adjacent ones of said first intervals, respectively; and second means coupled to said first means for successively and alternatingly performing a calculation in a Galois field to correct the error in connection with the other of said first and said second sequences within said first intervals and performing a calculation in a Galois field to correct the error in connection with the one of said first and second sequences within said second intervals.

* * * * *